United States Patent [19]

Kim

[11] Patent Number: 5,355,337

[45] Date of Patent: Oct. 11, 1994

[54] ARRANGEMENT OF REDUNDANT CELL ARRAY FOR SEMICONDUCTOR MEMORY DEVICE

[75] Inventor: Tae-jin Kim, Seoul, Rep. of Korea

[73] Assignee: Samsung Electronics Co., Ltd., Kyunggi-do

[21] Appl. No.: 867,461

[22] Filed: Apr. 13, 1992

[30] Foreign Application Priority Data

Aug. 21, 1991 [KR] Rep. of Korea ............... 91-14407

[51] Int. Cl.$^5$ .............................................. G11C 7/00
[52] U.S. Cl. ................................. 365/200; 365/201; 371/10.2
[58] Field of Search ............... 365/200, 201; 371/10.1, 371/10.2, 10.3

[56] References Cited

U.S. PATENT DOCUMENTS

| | | | |
|---|---|---|---|
| 4,745,582 | 5/1988 | Fukushi et al. | 365/200 |
| 4,796,233 | 1/1989 | Awaya et al. | 365/200 |
| 4,829,481 | 5/1989 | Johnson et al. | 365/200 |
| 4,862,416 | 8/1989 | Takeuchi | 365/200 |
| 4,881,202 | 11/1989 | Tsujimoto et al. | 365/200 |
| 4,985,866 | 1/1991 | Nakaizumi | 365/200 |
| 5,058,059 | 10/1991 | Matsuo et al. | 365/200 |
| 5,083,294 | 1/1992 | Okajima | 365/200 |

FOREIGN PATENT DOCUMENTS 3724509  2/1988  Fed. Rep. of Germany .

*Primary Examiner*—Eugene R. LaRoche
*Assistant Examiner*—Tan Nguyen
*Attorney, Agent, or Firm*—Cushman, Darby & Cushman

[57] ABSTRACT

In a semiconductor memory device having a normal memory cell array which includes repeating arrangements of a predetermined data arrangement and whose data is input and output in response to a column select line signal, an arrangement of a redundant cell array is disclosed. The arrangement has the same data arrangement as the minimally repeated unit of said normal memory cell array, wherein the data is in the redundant cell array input and output in response to a redundant column select line signal. According to the arrangement of the redundant cell array, the reliability and yield of the semiconductor memory device are enhanced.

3 Claims, 3 Drawing Sheets i=1,2,3 ···
n=0,2,4 ··· i=1,2,3 ···
n=0,2,4 ···

ARRANGEMENT OF REDUNDANT CELL ARRAY FOR SEMICONDUCTOR MEMORY DEVICE

BACKGROUND OF THE INVENTION

The present invention relates to a semiconductor memory device, and more particularly to the arrangement of a redundant cell array for a semiconductor memory device.

The higher integration of semiconductor memory devices increases the number of malfunctional memory cells on a chip. Due to this, all semiconductor memory devices now include a redundant cell array besides the normal memory cell array. A poor memory cell of the normal memory cell array is replaced with a memory cell of the redundant cell array. In order to carry out the replacement, in a column redundancy method for instance, a column decoder for the redundant memory cells decodes a column address to select a poor memory cell so as to designate a redundant memory cell's column corresponding to the poor memory cell's column.

FIG. 1 shows a conventional arrangement of a redundant cell array. Referring to FIG. 1, a dotted block N is a normal memory cell array, and a dotted block R is a redundant cell array. Word line WL and bit line BL intersections are shown as either small hollow circles or small filled-in circles. Logic "0" cells are represented by the small filled-in circles, while the small hollow circles are the logic "1" cells. Here, the memory cell of data level "1" may be changed with the memory cell of data level "0". A column select line (CSL) signal CSL0, CSL1, is a signal output from a normal column decoder (not shown), and a redundant column select line (RCSL) signal RCSL0, RSCL1 is a signal output from a redundant column decoder (not shown).

The CSL and RCSL signals are applied as high logic signals when selecting a column and as low logic signals when not selecting a column.

According to the construction of FIG. 1, the bit lines are arranged in order, i.e., 0101, 1010, 0101, etc. If a poor cell exists in a pair of bit lines BL0, for instance, a redundant column select signal is applied to redundant memory cell array R to replace the poor bit lines BL0 with a pair of redundant bit lines RBL0. Further, if poor cells exist in bit line cells BL0 and BL2, for instance, these poor bit line cells BL0 and BL2 are replaced with redundant bit line cells RBL0 and RBL2, respectively, according to the above process and thereby performing a repair operation. However, if poor cells exist in bit line pairs BL0 and BL4 of the normal memory cell array N, the poor cells of bit line pair BL0 are precisely repaired with redundant bit line pair RBL0. However, bit line pair BL4 of the poor bit lines is not repaired with redundant bit line pair RBL2. This is because, according to this memory cell array construction, bit line pairs BL4 and BL5 and redundant bit line pairs RBL2 and RBL3 are conversely connected to input/output lines I/O$_0$ and $\overline{\text{I/O}_0}$ and I/O$_1$ and $\overline{\text{I/O}_1}$. In other words the arrangement of bit line pairs BL4 and BLB is "0101" but the arrangement of redundant bit line pairs RBL2 and RBL3 is "1010". This does not allow for normal one-for-one replacement. This makes it impossible to precisely analyze a redundant cell during the test of a repaired chip so that it is difficult to detect the presence of a poor transistor or, to test the refresh period.

SUMMARY OF THE INVENTION

Therefore, it is an object of the present invention to provide the optimum arrangement of a redundant cell array which allows for the precise repair of a chip.

To accomplish the object, in a semiconductor memory device having a normal memory cell array which includes repeating arrangements of a predetermined data arrangement and whose data is input and output in response to a column select line signal, there is provided an arrangement of a redundant cell array which has the same data arrangement as the minimally repeated unit of the normal memory cell array, wherein the data is input and output in response to a redundant column select line signal.

BRIEF DESCRIPTION OF THE DRAWINGS

The above object and other advantages of the present invention will become more apparent by describing in detail a preferred embodiment of the present invention with reference to the attached drawings in which.

DETAILED DESCRIPTION OF THE INVENTION

Figure 2:
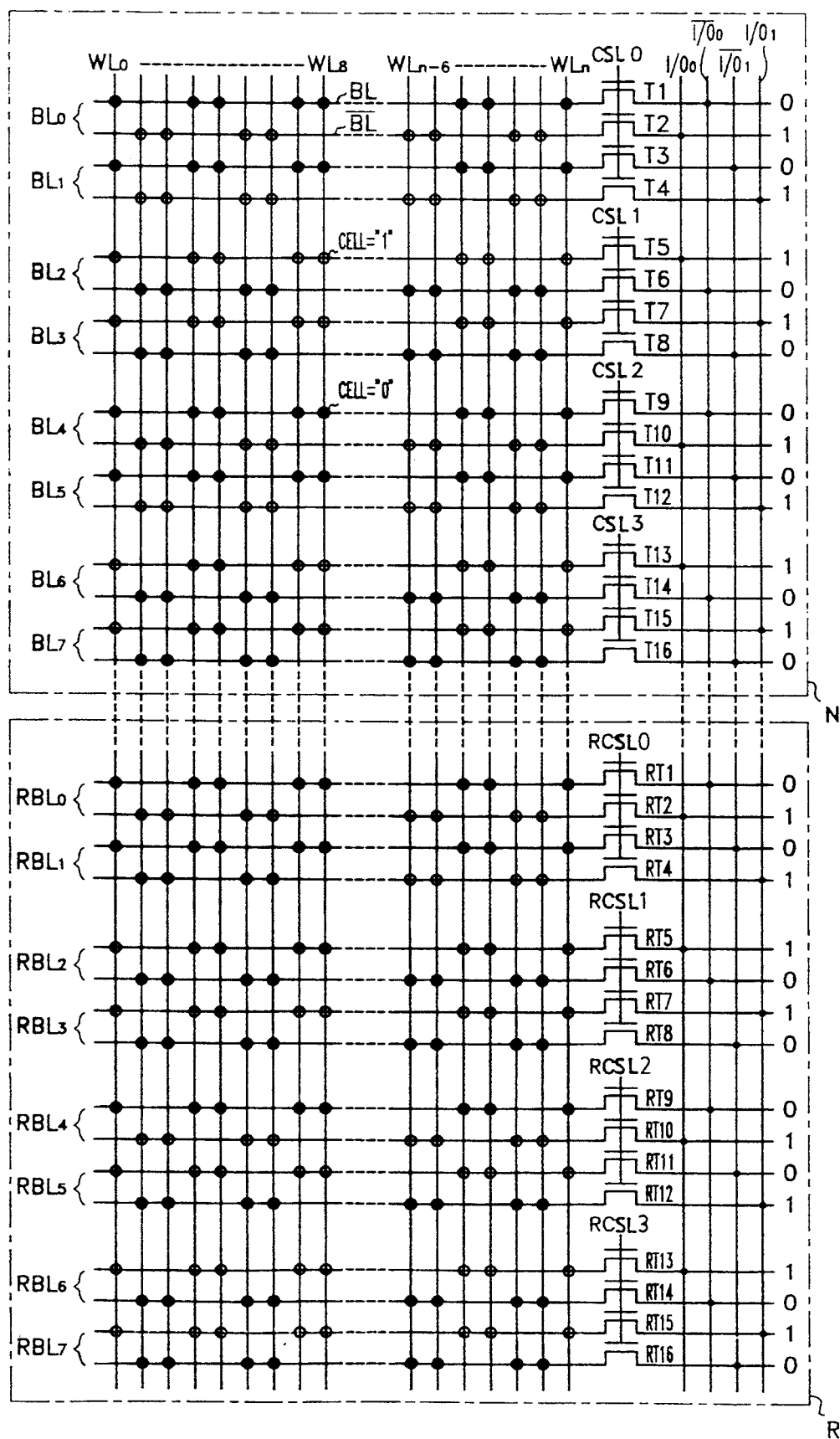
FIG. 2 illustrates an arrangement of a redundant cell array according to the present invention.

Referring to FIG. 2, the coupling method of the memory cells of a redundant cell array R is the same as that of a normal memory cell array N. The arrangement of an unshown memory cell array is the same as that of the normal cell array N, and a plurality of other redundant cell arrays having the same construction as the redundant cell array R may be installed. That is, the bit line arrangement of the normal memory cell array N (0101, 1010, 0101, 1010) is the same as that of the redundant cell array R. If poor cells exist in, for instance, pairs BL0 and BL4 of the bit lines of the normal memory cell array N, they are repaired with pairs RBL0 and RBL4 of bit lines of the redundant cell array R. Other poor cells of the bit lines are faithfully repaired with corresponding redundant bit lines.

Meanwhile, the arrangement of a memory cell array of the present invention requires a new method of generating a redundant column select line signal.

Figure 1:
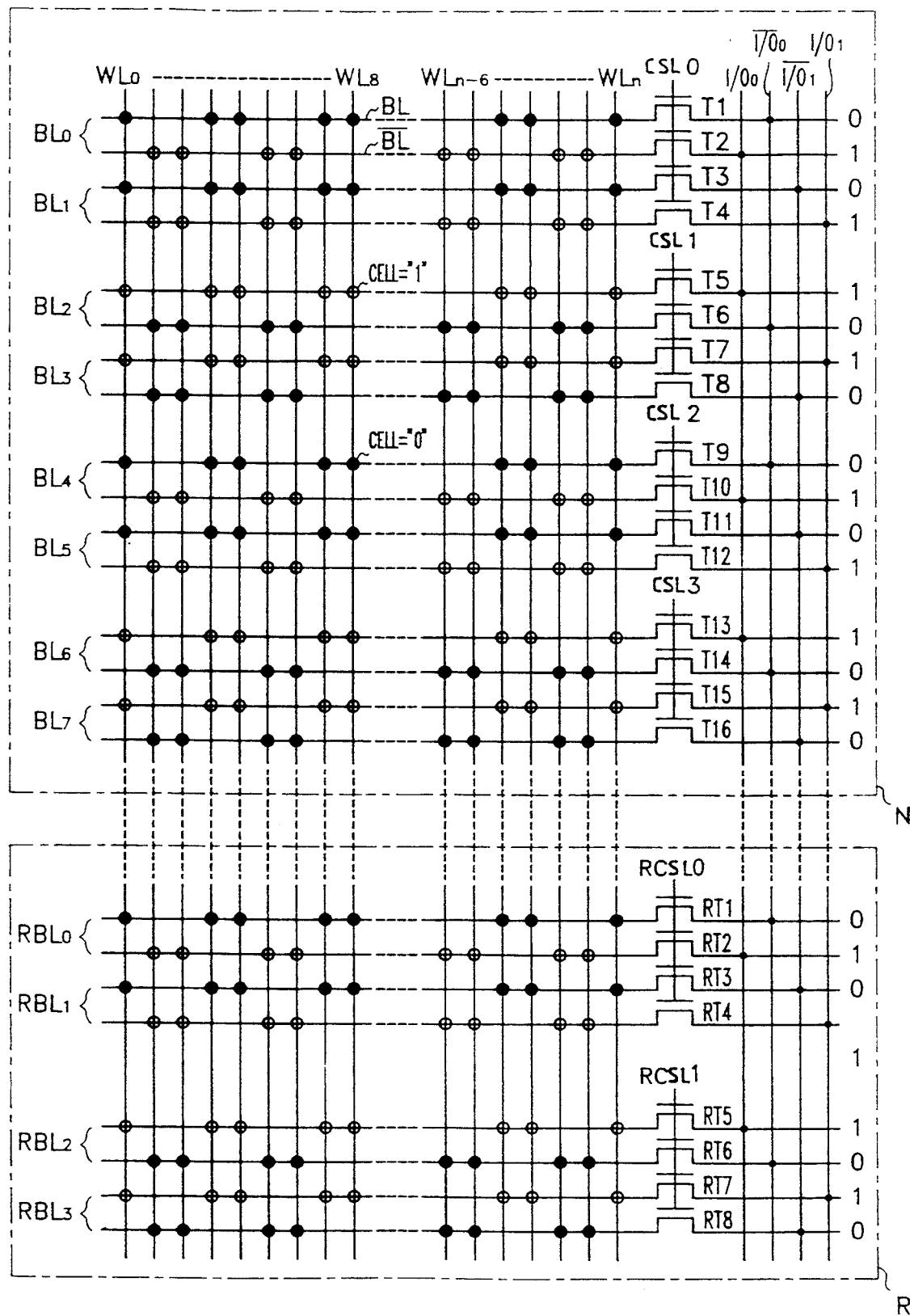
FIG. 1 illustrates a conventional arrangement of a redundant cell array.

According to the conventional arrangement of a redundant cell array as shown in FIG. 1, if poor cells exist in bit line pairs BL0 and BL6, in order to replace them with redundant bit line pairs RBL0 and RBL2, a column select line signal CSL0 is replaced with a redundant column select line signal RCSL0 and a column select line signal CSL3 is replaced with a redundant column select line signal RCSL1.

According to the arrangement of the redundant cell array of the present invention as shown in FIG. 2, when a redundant column select line is enabled instead of a column select line signal which would select a poor cell in the normal memory cell array, bit line pairs RBL0–RBL3 and RBL4–RBL7 of the redundant cell array should be individually selected by separately selecting redundant column select line signals RCSL0 and RCSL1 or RCSL2 and RCSL3. By using a least significant bit (LSB) for discriminating an odd column select signal and an even column select signal from the column select signals in order to select a poor cell in the normal cell array N, one signal is selected from the respective sets of redundant column select signals RCSL0 & RCSL1 and RCSL2 & RCSL3.

Figure 3A:
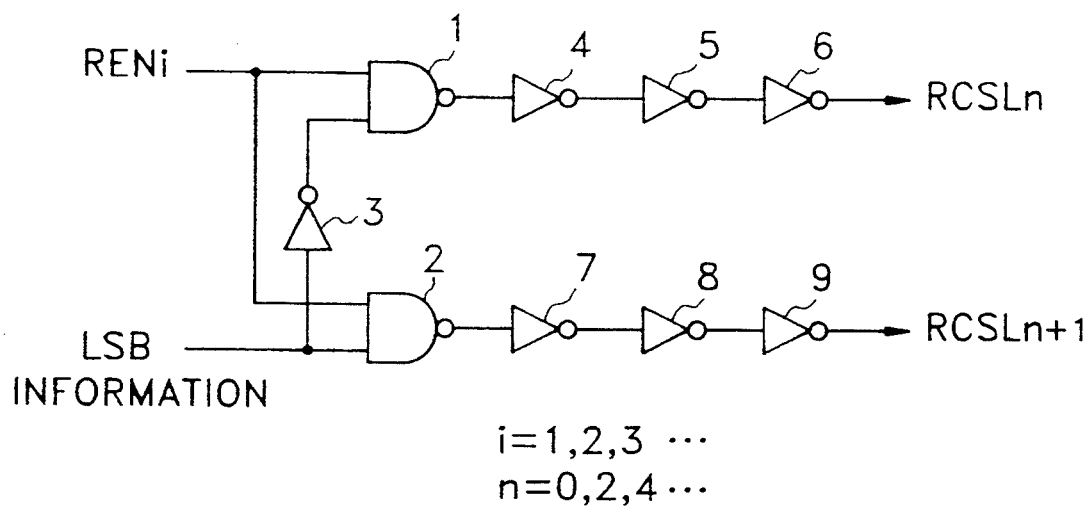
FIG. 3A is a circuit for generating a redundant column select line signal according to one embodiment of the present invention.

FIG. 3A illustrates a circuit for generating a redundant bit line select signal which uses a LSB to select line a desired redundant column select (RCSL). To the column select lines (CSL) of the normal memory cell array N so that a logic gate discriminates, for instance, redundant column select signals RCSL0 and RCSL1.

Referring to FIG. 3A, a redundant column select signal RCSLn is generated by a NAND gate 1 receiving a redundant enable signal RENi output from a redundant column decoder (not shown) and LSB information inverted by an inverter 3 and outputs three serial inverters 4, 5 and 6. A redundant column select signal $RCSL_{n+1}$ is generated by a NAND gate 2 also receiving redundant enable signal RENi and the LSB information and three outputting to serial inverters 7, 8 and 9. When the redundant enable signal RENi is high, the redundant column select signal responds to the LSB information so as to drive the redundant cell array R having the same data arrangement as that of the normal memory cell array N which includes the poor cell.

Figure 3B:
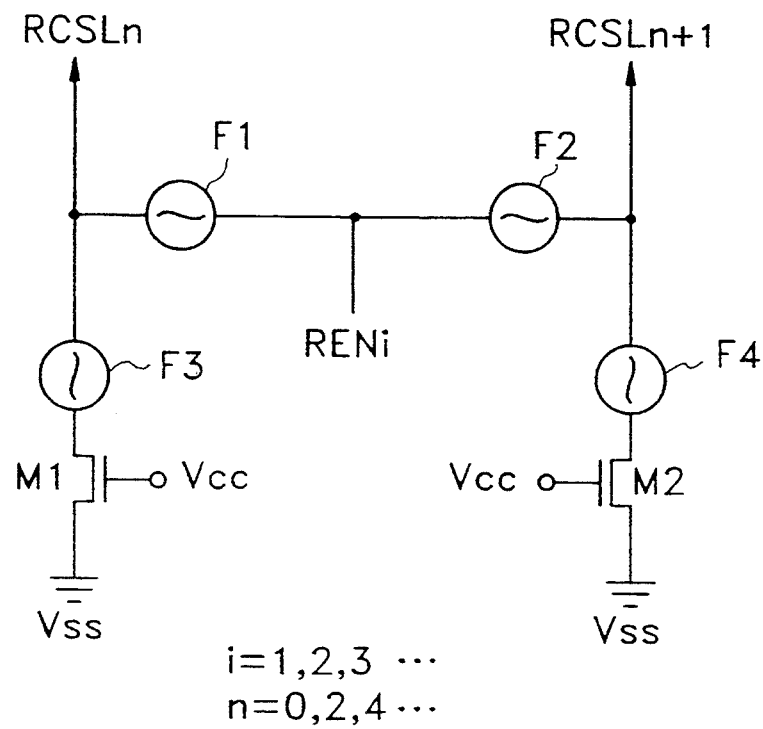
FIG. 3B is a circuit for generating a redundant column select line signal according to another embodiment of the present invention.

FIG. 3B illustrates a redundant bit line select signal generator according to another embodiment of the present invention which is directed to a replacement method using fuses F1, F2, F3, and F4. Using only the redundant enable signal RENi, the circuit has the fuses cut by a laser projection method to drive the desired redundant cell array. The embodiments of FIGS. 3A and 3B may be of various forms.

As described above in detail, according to the structure of the redundant cell array of the present invention, problems occurring during various chip tests and tests to determine whether or not a poor cell exists, are easy to detect. As a result, the reliability of a semiconductor memory device is enhanced.

While the invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:
   a first number of redundant memory cell arrays and a second number of normal memory cell arrays, said first number being less than said second number, each of said redundant and normal memory cell arrays comprising:
   a plurality of repeat arrangements of a predetermined unit, said predetermined unit comprising a first and second bit line group, each bit line group being controllable for inputting and outputting data by a first and a second column select signal;
   said first bit line group having bit lines arranged in a first logic arrangement defined as (0101) and said second bit line group having bit lines arranged in a second successive logic arrangement defined as (1010);
   wherein each redundant memory cell array is built up by repeating an arrangement of a smallest length unit of a corresponding normal cell array, said smallest length unit comprising a first and second redundant bit line group for inputting and outputting data by one of a corresponding first and second redundant column select line signals.

2. The semiconductor device of claim 1, wherein said first and second redundant column select line signals is output from a logic decoder circuit coupled to said redundant memory cell arrays, said logic decoder circuit being responsive to an external signal, indicative of a faulty cell in one of said normal memory cell arrays, and to a bit-addressing signal, for selectively controlling a logical replacement of said faulty memory cell with a redundant memory cell in a corresponding redundant memory cell array having a similar repeat arrangement.

3. The semiconductor device of claim 1, wherein said first and second redundant column select line signals is output from a programmable fuse circuit coupled to said redundant memory cell arrays, said programmable fuse circuit being responsive to a programmed fusing signal, indicative of a faulty cell in one of said normal memory cell arrays, for selectively controlling a logical replacement of said faulty memory cell with a redundant memory cell in a corresponding redundant memory cell array having a similar repeat arrangement.

* * * * *